(12) United States Patent
Bu

(10) Patent No.: US 10,847,596 B2
(45) Date of Patent: Nov. 24, 2020

(54) BENDABLE DISPLAY PANEL AND FABRICATING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Chenghao Bu, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 34 days.

(21) Appl. No.: 15/744,758

(22) PCT Filed: Jan. 8, 2018

(86) PCT No.: PCT/CN2018/071696
§ 371 (c)(1),
(2) Date: Oct. 25, 2018

(87) PCT Pub. No.: WO2019/090961
PCT Pub. Date: May 16, 2019

(65) Prior Publication Data
US 2019/0148474 A1   May 16, 2019

(30) Foreign Application Priority Data

Nov. 10, 2017  (CN) .......................... 2017 1 1128413

(51) Int. Cl.
*H01L 51/00*  (2006.01)
*H01L 27/32*  (2006.01)
(Continued)

(52) U.S. Cl.
CPC ...... *H01L 27/3276* (2013.01); *H01L 27/1259* (2013.01); *H01L 51/0097* (2013.01);
(Continued)

(58) Field of Classification Search
CPC ......... H01L 51/0097; H01L 2251/5338; H01L 51/56; H01L 27/1259
See application file for complete search history.

(56) References Cited

U.S. PATENT DOCUMENTS 9,564,483 B2 * 2/2017 Seo ..................... H01L 27/1218
2002/0090779 A1  7/2002 Jang
(Continued)

FOREIGN PATENT DOCUMENTS

CN    102337541 A    2/2012
CN    102412128 A    4/2012
(Continued)

OTHER PUBLICATIONS

The First Office Action for Chinese application No. 2017111284138 dated Dec. 17, 2019.

*Primary Examiner* — Jaehwan Oh
(74) *Attorney, Agent, or Firm* — Hemisphere Law, PLLC; Zhigang Ma

(57) ABSTRACT

A bendable display panel and a fabricating method thereof are disclosed, including: providing the flexible substrate and the inorganic film layer formed on the flexible substrate, the inorganic film layer includes a deep hole region disposed in a bending area; dry etching the deep hole region to form a deep hole having a slope, and a bottom of the deep hole is located on the flexible substrate; filling the deep hole with an organic material to form an organic film layer; and forming a metal wiring layer on the inorganic film layer and the organic film layer. In the method, a deep hole having a slope is formed by gas dry etching. The etching method can
(Continued)

control the slope to improve the climbing ability of the metal wiring, and reduce or avoid the loss of electrical signal caused by disconnection of the metal wiring, thereby improving the display panel quality.

11 Claims, 7 Drawing Sheets

(51) Int. Cl.
  *H01L 51/56* (2006.01)
  *H01L 27/12* (2006.01)
  *H01L 51/52* (2006.01)
(52) U.S. Cl.
  CPC .......... *H01L 51/56* (2013.01); *H01L 51/5253* (2013.01); *H01L 2227/32* (2013.01); *H01L 2227/323* (2013.01); *H01L 2251/5338* (2013.01)

(56) References Cited

U.S. PATENT DOCUMENTS

| | | | | |
|---|---|---|---|---|
| 2004/0147093 A1* | 7/2004 | Marty | ............... | H01L 21/76232 438/442 |
| 2006/0166106 A1* | 7/2006 | Chandrachood | .......... | G03F 1/80 430/5 |
| 2006/0166107 A1* | 7/2006 | Chen | ......................... | G03F 1/80 430/5 |
| 2006/0216921 A1* | 9/2006 | Kato | ................. | H01L 21/76843 438/618 |
| 2014/0291633 A1* | 10/2014 | Baek | .................... | H01L 51/0097 257/40 |
| 2016/0247867 A1* | 8/2016 | Nguyen | ............ | H01L 29/78696 |
| 2017/0090661 A1* | 3/2017 | Kim | ....................... | G06F 3/0412 |
| 2017/0317299 A1* | 11/2017 | Choi | .................... | H01L 51/5253 |
| 2019/0041915 A1* | 2/2019 | Park | ...................... | G06F 1/1652 |
| 2019/0095007 A1* | 3/2019 | Jeong | ................... | G06F 1/1643 |

FOREIGN PATENT DOCUMENTS

| | | |
|---|---|---|
| CN | 103715138 A | 4/2014 |
| CN | 106601133 A | 4/2017 |
| CN | 106952937 A | 7/2017 |
| CN | 106960812 A | 7/2017 |
| CN | 106972030 A | 7/2017 |
| CN | 107195252 A | 9/2017 |
| CN | 107424957 A | 12/2017 |
| CN | 107833906 A | 3/2018 |

* cited by examiner

BENDABLE DISPLAY PANEL AND FABRICATING METHOD THEREOF

RELATED APPLICATIONS

The present application is a National Phase of International Application Number PCT/CN2018/071696, filed Jan. 8, 2018, and claims the priority of China Application 201711128413.8, filed Nov. 10, 2017.

FIELD OF THE DISCLOSURE

The disclosure relates to the field of display technology, and in particular, to a bendable display panel and a fabricating method thereof.

BACKGROUND

Organic light-emitting diode (OLED) displays quickly occupy the high-end market of display panels due to their high contrast ratio, wide color gamut, wide viewing angle and ultra-thinness. And with its short life, grainy and other defects continue to improve, it is foreseeable that OLED display will become the mainstream. Another advantage of OLED displays is that they can be bent, folded, and curled. This advantage makes them widely used in curved screens, folding screens, or narrow borders (borderless) screens.

At present, there are many narrow frame OLED mobile phone screens on the market, and their design concepts are similar. Two embodiments as shown in FIG. 1 or FIG. 2, the display screen adopts a flexible substrate made of a polymer material. In addition to the active area (AA), the display screen is also divided into four border areas, i.e., a top border area, a left border area, a right border area, and a bottom border area, these four border areas include various metal wires including gate on array (GOA), the bottom border area also includes a driver IC of the display panel and a flexible printed circuit (FPC) border, applied to drive and transport the electrical signal of the entire screen. And the bottom border area can even be bendable, and the bottom border area of the entire array substrate including the driver IC and FPC are bent to the back of the screen to perform bonding, thereby increasing the screen-to-body ratio to reduce the width of the border.

However, in order to bend the entire bottom border area to the back of the screen, it is necessary to completely etch away the hard-to-bend inorganic layer film in the bending area of the array substrate, leaving only the flexible substrate, filling pliable organic material in this area, in the Bending area, the metal wire of the Fanout area under the AA area is connected with the metal wire of the driver IC through the metal wire designed to have a well flexural endurance, so as to achieve smooth transmission of the electrical signal. However, in the related art, there are still some problems in the art of reducing the width of the border by bending the bottom border area. For example, the inorganic layer etched away from a deep hole (generally referred to as DH) is deep and easily forms a steeper taper corner, after being filled with organic materials and electroplated the metal wire, the metal wire is difficult to climb on the steps of the DH region, the step coverage is poor, the metal wire at the step is much thinner than the metal wire of the other areas, which is prone to break, thereby resulting in open circuit and making the entire display panel signal lost and resulting in irreparable damage.

SUMMARY

A technical problem to be solved by the disclosure is to provide a bendable display panel and a fabricating method thereof to solve the technical problems that in the prior art, the metal wire is difficult to climb in the steps of the DH region, the step coverage is poor, the metal wire at the step is much thinner than the metal wire of the other areas, which is prone to break, thereby resulting in open circuit and making the entire display panel signal lost.

To solve the technical problem, further another technical proposal of this disclosure is to provide a bendable display panel and a fabricating method thereof, including: providing the flexible substrate and the inorganic film layer formed on the flexible substrate, the inorganic film layer includes a deep hole region disposed in the bending area; dry etching the deep hole region to form a deep hole having a slope, and a bottom of the deep hole is located on the flexible substrate; filling the deep hole with an organic material to form an organic film layer, and a thickness of the organic film layer ranges from 1.4 to 1.6 μm; forming a metal wiring layer on the inorganic film layer and the organic film layer, further including: a planarization layer, an anode layer, and a pixel layer sequentially formed on the metal wiring layer to form a display panel.

In order to solve the above technical problem, another technical solution adopted by the present application is to provide a manufacturing method of a flexible display panel, the method including: providing a flexible substrate on which an inorganic film layer is formed, and the inorganic film layer includes a deep hole region disposed in a bending area; dry-etching the deep hole region by gas to form a deep hole having a slope, and a bottom of the deep hole is located on the flexible substrate Filling the deep hole with an organic material to form an organic film layer; and forming a metal wiring layer on the inorganic film layer and the organic film layer.

To solve the technical problem, further another technical proposal of this disclosure is a bendable display panel, the bendable display panel includes a flexible substrate, an inorganic film layer and an organic film layer sequentially disposed on the flexible substrate, and a metal wiring layer disposed on the inorganic film layer and the organic film layer; the fabricating method of the organic film layer and the metal wiring layer is as described above.

The beneficial effect of the present invention is that the fabricating method of the bendable display panel provided by the present application is to form a deep hole having a slope by gas dry etching, and the etching method can control the slope of the deep hole, so as to improve the climbing ability of the metal wiring, and reduce or avoid the loss of electrical signal caused by disconnection of the metal wiring, thereby improving the display panel quality.

DETAILED DESCRIPTION OF PREFERRED EMBODIMENTS

The technical proposals in the embodiments of the present invention will be described in detail below in connection with the accompanying drawings in the embodiments of the present invention.

Figure 1:
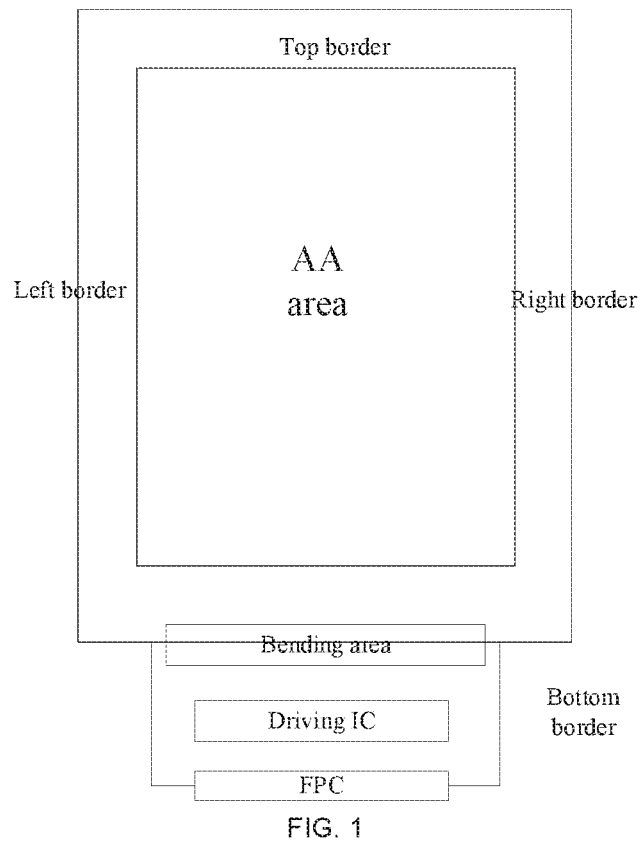
FIG. 1 is a structural schematic view of an embodiment of a display panel according to the prior art.
Figure 2:
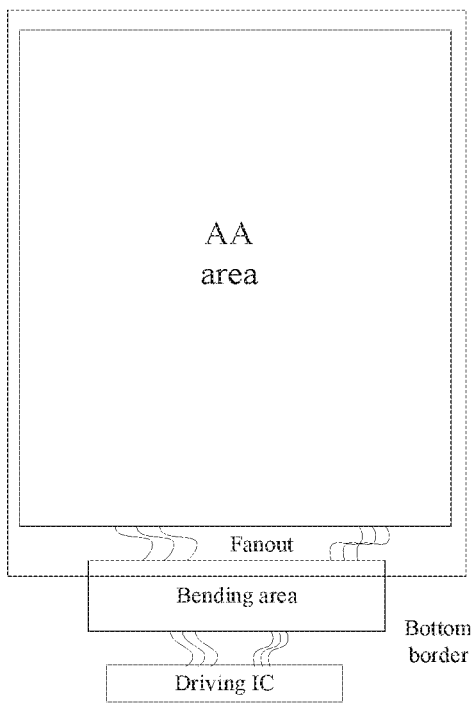
FIG. 2 is a schematic structural view of another embodiment of a display panel according to the prior art.
Figure 3:
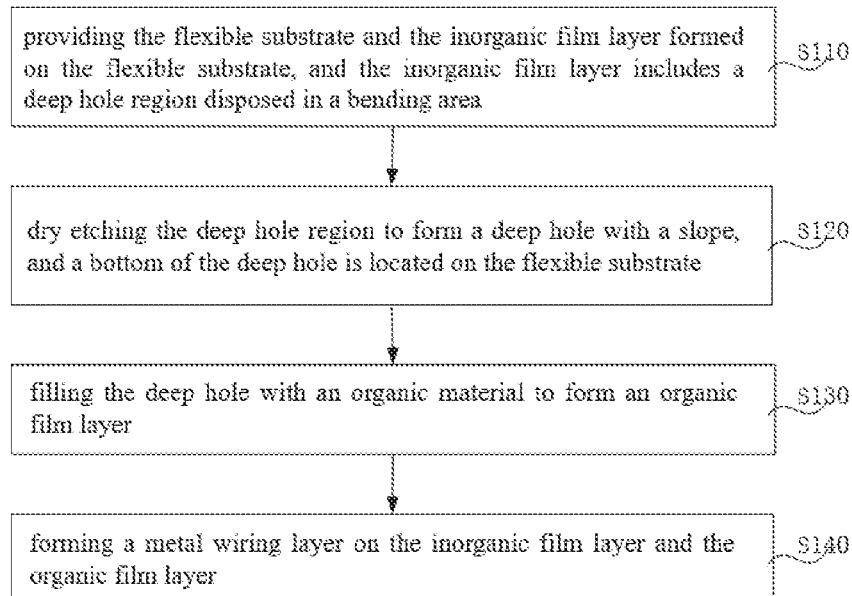
FIG. 3 is a schematic flow chart of a first embodiment of a fabricating method of a bendable display panel according to the present application.

Referring to FIG. 3, FIG. 3 is a schematic flow chart of a first embodiment of a fabricating method of a bendable display panel according to the present application. It should be noted that, if there are substantially the same results, the method in the present application is not limited to the sequence shown in FIG. 3. As shown in FIG. 3, the method includes the following steps:

Step S110: providing the flexible substrate and the inorganic film layer formed on the flexible substrate, and the inorganic film layer includes a deep hole region disposed in the bending area.

In this step, a bendable flexible substrate is first provided. Typically, the flexible substrate adopts a polymer material such as polyimide plastic, polyetheretherketone or a transparent conductive polyester; in the present embodiment, a polyimide (referred to as PI) material is adopted because of its heat safe, wide temperature range, no significant melting point, high insulation properties, and stable dielectric constant, so it is widely used in the flexible substrates.

An inorganic layer is formed on the flexible substrate, and the inorganic layer includes but not limited a barrier layer, a buffer layer, an active layer, a gate insulating layer, a gate layer, an interlayer dielectric layer, a source-drain layer, and the like, and the fabricating method and process thereof can refer to the methods and processes for fabricating the display panel in the prior art, and the present application is not limited herein.

In this embodiment, after the inorganic film layer is fabricated, the inorganic film layer includes a display portion and a bending area, the bending area is configured to perform bending or folding of the flexible panel, and is usually configured as an inorganic layer that does not include the active layer and various metal layers. Since the inorganic layer is prone to cracking or even bending or folding inorganic film prone to cracking or even fracture due to bending or folding, it is necessary to use the organic film layer to replace. Simultaneously, the inorganic film layer further includes a deep hole region arranged in the bending area, that is, a deep hole region to be etched is further arranged in the bending area of the inorganic film layer for removing the organic film layer in the deep hole region.

Step S120: dry etching the deep hole region to form a deep hole having a slope, and a bottom of the deep hole is located on the flexible substrate.

Etching is a very important step in the semiconductor manufacturing process, the microelectronics manufacturing process, and the display panel manufacturing process, and is a major process of the patterning process associated with lithography. With the development of micro-manufacturing processes, etching has become a generic term for peeling and removal of materials by solution, reactive ion or other mechanical means.

The easiest and most common types of etching are dry etching and wet etching. Obviously, wet etching uses solvents or solutions for etching, and dry etching has many kinds of types including light volatilization, vapor phase etching, plasma etching and the like. Dry etching has the advantages such as good anisotropy, controllability, flexibility, good repeatability, safe operation of fine lines, and high cleanliness, and is widely used in the micro-fabrication processes with refinement and high requirement.

In the present embodiment, dry etching by adopting the $SF_6$ gas means to dry etching the deep hole region by $SF_6$ gas to form a deep hole having a slope, and a bottom of the deep hole is located on the flexible substrate. Dry etching by the plasma gas with anisotropy and good selectivity, a slow slope of the deep hole can be etched out.

Step S130: filling the deep hole with an organic material to form an organic film layer.

After etching the inorganic film in the deep hole region of the bending area, a deep hole having a slope is formed, and an organic material is filled into the deep hole to form an organic film layer. In general, the organic film layer is lower than or flat on the inorganic film layer. Compared with the inorganic film, the organic film layer has greatly improved in the bending performance. Since the bottom of the deep hole is located on the flexible substrate, all the inorganic film layers above the flexible substrate are etched away and filled into the organic film layer, the bending endurance is further enhanced.

Step S140: forming a metal wiring layer on the inorganic film layer and the organic film layer.

A metal wiring layer is formed on the flexible substrate filled with the organic film layer and is configured to electrically connect the display portion of the inorganic film layer to an external device through the bending area. Therefore, it is necessary to form a metal wiring layer on the organic film of the inorganic film layer and the bending area of the display portion.

In this embodiment, since the gas dry etching process is used to form the deep holes with gentle slope; after the organic film layer is filled, the slope between the organic film layer and the inorganic film layer is further slowed down, so that the metal wire climbing layer of the metal wire lining layer is easy to climb and the disconnection phenomenon is hard to occur.

The fabricating method of the bendable display panel provided by the present application is to form a deep hole having a slope by gas dry etching, and the etching method can control the slope of the deep hole, so as to improve the climbing ability of the metal wiring, and reduce or avoid the loss of electrical signal caused by disconnection of the metal wiring, thereby improving the display panel quality.

Figure 4:
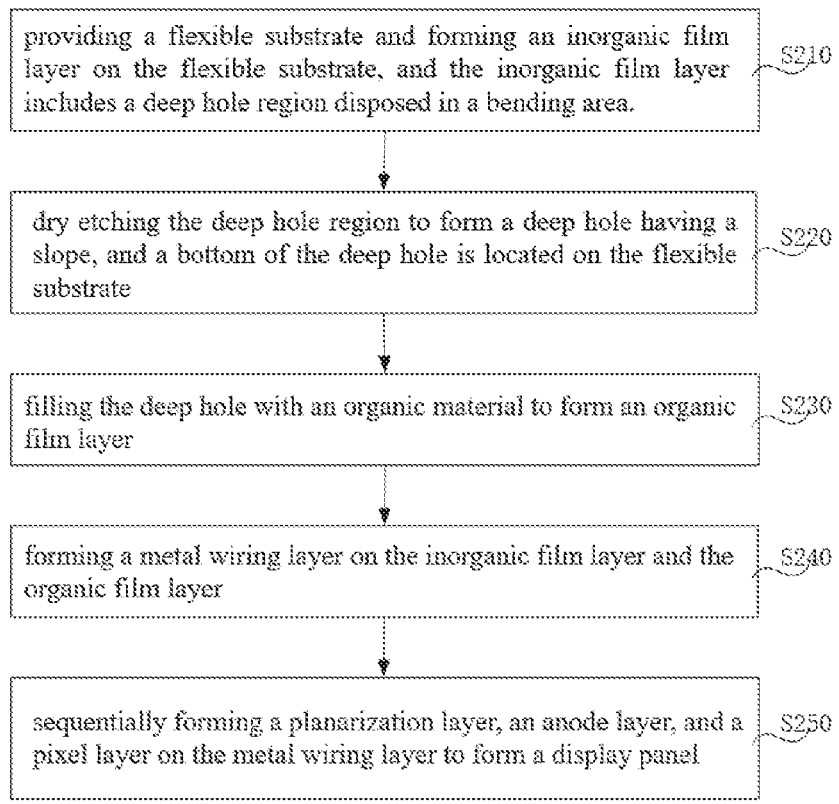
FIG. 4 is a schematic flow chart of a second embodiment of a fabricating method of a bendable display panel according to the present application.
Figure 5:
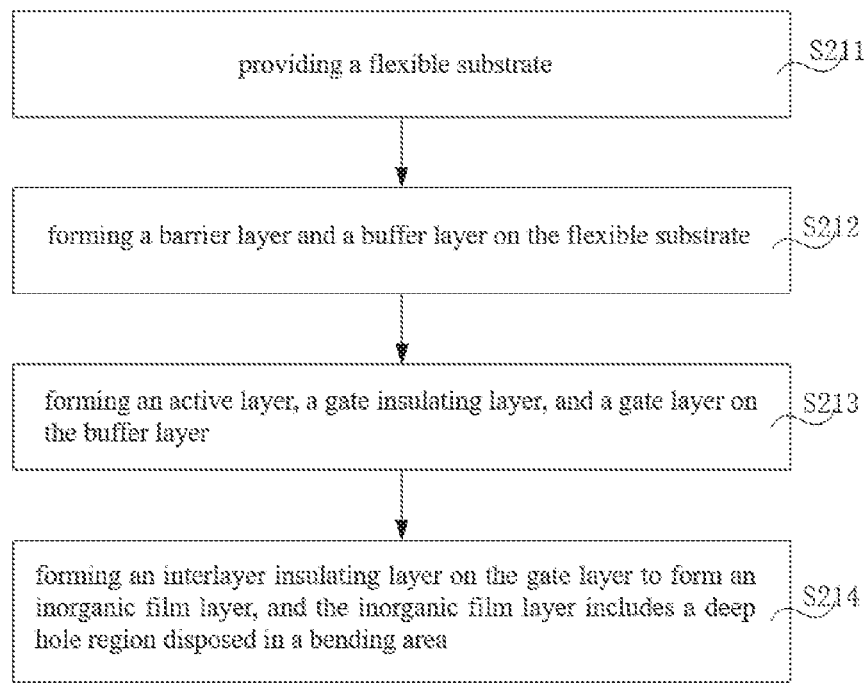
FIG. 5 is a schematic flow chart of step S210 in the second embodiment of the present application.

Referring to FIG. 4 to 10, FIG. 4 is a schematic flow chart of a second embodiment of a fabricating method of a bendable display panel according to the present application, and FIG. 5 is a schematic flow chart of step S210 in the second embodiment of the present application. As shown in FIG. 4, the specific fabrication method of the bendable display panel includes the following steps:

Step S210: providing a flexible substrate and forming an inorganic film layer on the flexible substrate, and the inorganic film layer includes a deep hole region disposed in the bending area.

The content of this step is basically the same as that of step S110, and details are not described herein again. It should be noted that step S210 may further be subdivided into fabricating methods including each layer, specifically including steps S211 to S214. The specific fabricating method includes the following steps:

Step S211: providing a flexible substrate.

Figure 6:
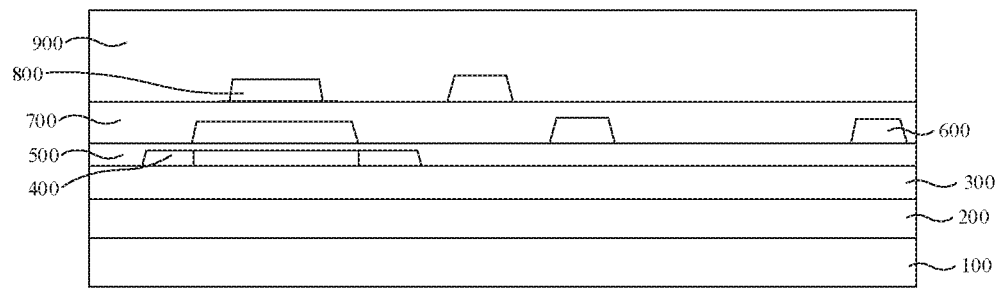
FIG. 6 is a schematic view of the fabrication of one embodiment of an inorganic film and an organic film according to the present application.

Referring to FIG. 6, FIG. 6 is a schematic diagram of fabrication of an inorganic film and an organic film layer according to an embodiment of the present application. In the embodiment, the flexible substrate 100 is made of PI flexible material, and its thickness is not limited.

Step S212: forming a barrier layer and a buffer layer on the flexible substrate.

The barrier layer 200 and the buffer layer 300 are formed on the flexible substrate 100, and a vapor deposition technique is generally used. Vapor deposition technology is the use of the physical and chemical processes in the gas phase to form functional or decorative metal, non-metallic or compound coating on the work piece surface. Vapor deposition technology in accordance with the film forming mechanism can be classified into chemical vapor deposition, physical vapor deposition, and plasma vapor deposition, in this embodiment, chemical vapor deposition technology is used mostly.

A chemical vapor deposition technique is used to deposit a nano-silicon oxide ($SiO_x$) on a water/oxygen barrier layer 200 for blocking water and air. The water/oxygen barrier layer 200 has a thickness of about 5000 Å (Angstrom, length unit), and then a chemical vapor deposition technique is used to deposit a mixture of nano-silicon-based oxide ($SiO_x$) and nano-silicon nitride ($SiN_x$) on a buffer layer 300, the thickness of the buffer layer 300 is about 3500 Å, providing the conditions for the follow-up fabrication of silicon. In this embodiment, the water-oxygen barrier layer 200 and the buffer layer 300 can be generally fabricated in the same chamber. The thickness of the water-oxygen barrier layer 200 and the buffer layer 300 is only an example and not limitative. The thickness of other layers is also, for the sake of intuition and understanding, merely an example and not limited.

Step S213: forming an active layer, a gate insulating layer, and a gate layer on the buffer layer.

With continued reference to FIG. 6, an amorphous silicon layer of 500 Å is deposited on the buffer layer 300 and then crystallized to expose the active layer 400, i.e., the Poly-Si layer.

A gate insulating layer and a gate layer are deposited on the active layer 400. In this embodiment, the gate insulating layer includes a first gate insulating layer 500 (GI1) and a second gate insulating layer 700 (GI2), correspondingly, the gate layer includes the first gate layer 600 and the second gate layer 800. The first gate insulating layer 500 and the second gate insulating layer 700 is deposited using $SiO_x$ or $SiN_x$, and Moscovium metal is used to form the first gate layer 600 and the second gate layer 800 by using radio frequency sputtering.

The specific process is as follows: depositing a first gate insulating layer 500, i.e., GI1-$SiO_x$, on the active layer 400 by a thickness of 1000 Å; performing radio frequency sputtering to a first gate layer 600 of 500 Å, i.e., GE1, and a first gate GE1 (601) and a metal signal transmission wiring (602) of a gate layer are formed after the first gate layer 600 is exposed and etched; then depositing a second gate insulating layer 700, i.e., GI2-$SiN_x$, on the first gate insulating layer 600 by a thickness of 1100 Å. The second gate metal layer 800 is grown by magnetron sputtering. Depending on the actual needs, the thickness of the second gate metal layer 800 is the same as or different from the thickness of the first gate layer 600; after being exposed and etched, the second gate electrode GE2 (801) and a second a metal signal transmission wiring (802) of a metal signal transmission wiring of a gate layer are formed.

Step S214: forming an interlayer insulating layer on the gate layer to form an inorganic film layer, and the inorganic film layer includes a deep hole region disposed in the bending area.

Figure 7:
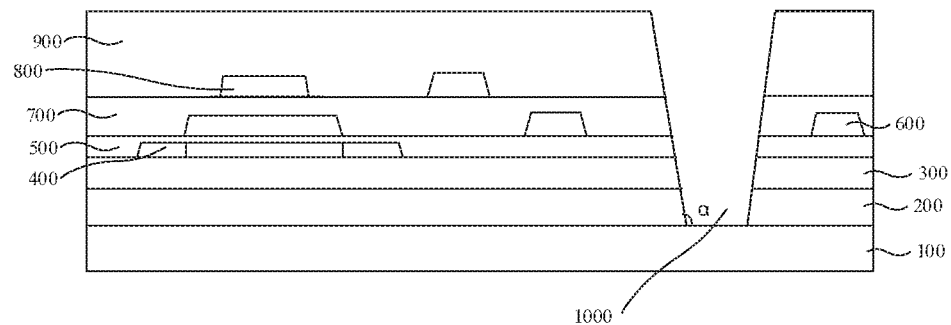
FIG. 7 is a schematic view of one embodiment of a deep hole region fabricated by the one-step method of the present application.

The interlayer insulating layer is formed at the gate layer, that is, the interlayer insulating layer 900 (ILD layer) is deposited on the second gate electrode layer 800 by a thickness of 5000 Å, so as to fabricate an inorganic film layer. The inorganic layer includes a display unit A and a bending area B, the bending area B is configured to perform a bending or folding to the flexible panel, and usually configured as the inorganic layer not containing the active layer and the various metal layers, since the inorganic layer is prone to cracking or even bending or folding inorganic film prone to cracking or even fracture due to bending or folding, it is necessary to use the organic film layer to replace. Referring to FIG. 7, FIG. 7 is a schematic view of one embodiment of a deep hole region fabricated by the one-step method of the present application, the inorganic layer further includes a deep hole region 1000 arranged in the bending area B, that is, a deep hole region 1000 to be etched is further arranged in the bending area B of the inorganic film layer for removing the organic film layer in the deep hole region 1000.

Step S220: dry etching the deep hole region to form a deep hole having a slope, and a bottom of the deep hole is located on the flexible substrate.

In the present embodiment, dry etching by adopting the O gas means to dry etching the deep hole region 1000 by $SF_6$ gas to form a deep hole having a slope, and a bottom of the deep hole is located on the flexible substrate 1000. Dry etching by the plasma gas with anisotropy and good selectivity, a slow slope of the deep hole can be etched out.

Specifically, the interlayer insulating layer 900 is exposed by using a photo mask with a pattern of the DH region. After development, all the inorganic film layers in the DH region are etched away by gas dry etching until the bottom of the deep hole region 1000 is located on the flexible substrate, that is, the inorganic film on the flexible substrate in the deep hole region 1000 is completely etched away.

In the above steps S211 to S214, the total thickness of the inorganic film layer is about 1.56 μm, mainly including the barrier layer of 5000 Å, the buffer layer of 3500 Å, the gate insulating layer of 2100 Å, and the interlayer insulating layer of 5000 Å. In this embodiment, in order to save the etching process time and increase the production capacity, one-step etching or two-step etching may be used.

The one-step etching refers to perform the dry etching to the deep hole region by $SF_6$ to form a deep hole having a first slope. Specifically, all of the inorganic film layers, that is, the inorganic film layer of 1.56 μm are etched away by using $SF_6$ gas for an etching time about 350 seconds. Since the one-step etching is faster, a first taper angle of the DH region is steeper, referring to the first taper angle α in FIG. 7.

Figure 8:
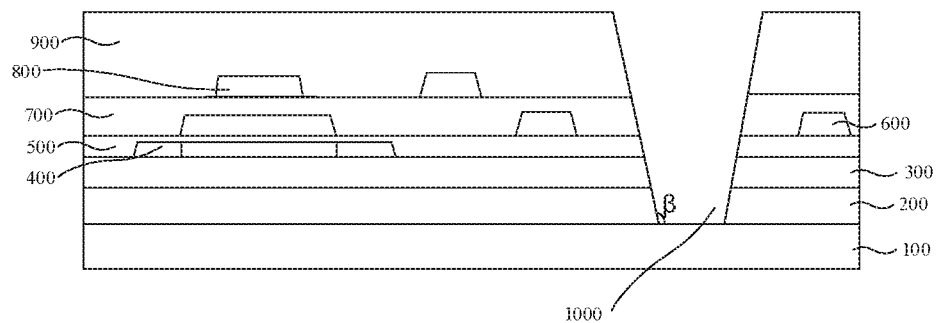
FIG. 8 is a schematic view of one embodiment of a deep hole region fabricated by the two-step method of the present application.

Referring to FIG. 8, FIG. 8 is a schematic view of one embodiment of a deep hole region fabricated by the two-step method of the present application, the two-step etching refers to perform the dry etching to the deep hole region by $SF_6$ gas, and then perform the second gas dry etching to the deep hole region by $C_2HF_5$, having a first slope by $C_2HF_5$ gas to form a deep hole 1000 having a second slope. Generally speaking, two-step etching refers to perform the etching in two steps, specifically, in the first step, $SF_6$ gas is used to etch away the ILD layer of 5000 Å, and the gate insulating layer of 2100 Å, and the etching time is approximately 150 seconds; in the second step, pentafluoroethane ($C_2HF_5$) gas is used to etch away the remaining buffer layer of 3500 Å and the barrier layer of 5000 Å; and in the second step, the dry etching rate of $C_2HF_5$ gas is slow, the etching time is about 650 seconds, thereby resulting in the etching time in the entire DH region is longer, about 800 seconds. The two-step etching is slower, and the second taper angle of the DH region is slower, referring to the second taper angle β in FIG. 8. The one-step etching and two-step etching may be selected according to actual needs, which is not limited in this embodiment. In addition, in the one-step or two-step method, the other steps thereof are the same except for the inconsistencies of used gas, resulting the differences in etching time and speed. In other embodiments, the gas etching by only pentafluoroethane ($C_2HF_5$) or other gases may be used to generate a larger taper corner.

Through the above description, it is learned that the first slope is steeper than the second slope or the second slope is slower than the first slope, so that in the same case, the slope length of the first slope is smaller than the slope length of the second slope. The first included angle α between the first slope and the flexible substrate ranges from 95° to 135°; the second included angle β between the second slope and the flexible substrate ranges from 95° to 135°; the first included angle α is smaller than the second included angle β, of course, the bigger the angle, the better.

Step S230: filling the deep hole with an organic material to form an organic film layer.

After etching the inorganic film in the deep hole region of the bending area V, a deep hole having a slope is formed, and an organic material is filled into the deep hole to form an organic film layer 1100. The thickness of the organic film layer 1100 ranges from 1.4 to 1.6 μm; Generally, the organic film layer in the deep hole region does not completely fill the deep hole. That is to say, the thickness of the organic material in the deep hole is slightly lower than the total thickness of the deep hole region, that is, the organic film layer is lower than the inorganic film layer. In the above case, the preferred range is less than or equal to 1.5 μm.

Figure 9:
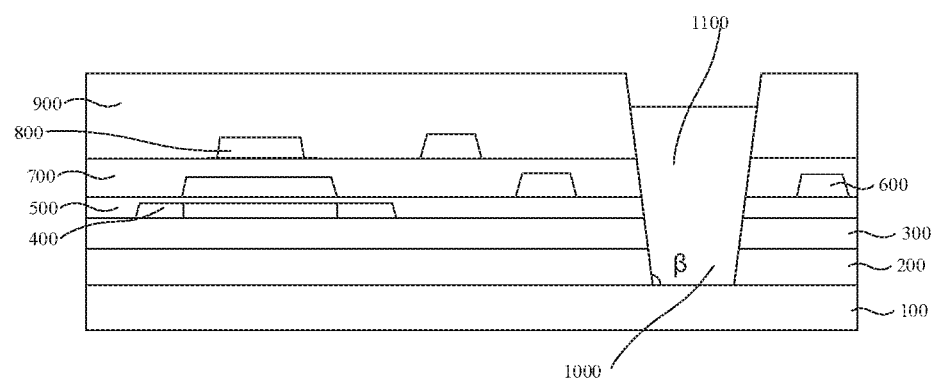
FIG. 9 is a schematic structural view of an embodiment of filling an organic material according to the present application.

Referring to FIG. 9, FIG. 9 is a schematic structural view of an embodiment of filling an organic material according to the present application. Specifically, the organic material is uniformly coated on the interlayer insulating layer ILD and the deep hole by using a photo resist coating machine, and the organic material in other areas except the deep hole DH is removed by exposure and development, leaving only the organic material layer 1100 in the DH region, i.e., the organic film layer 1100, the organic film layer does not completely fill the deep hole region, so the thickness of the organic film layer in the deep hole is slightly lower than the total thickness of the deep hole.

Step S240: forming a metal wiring layer on the inorganic film layer and the organic film layer.

Figure 10:
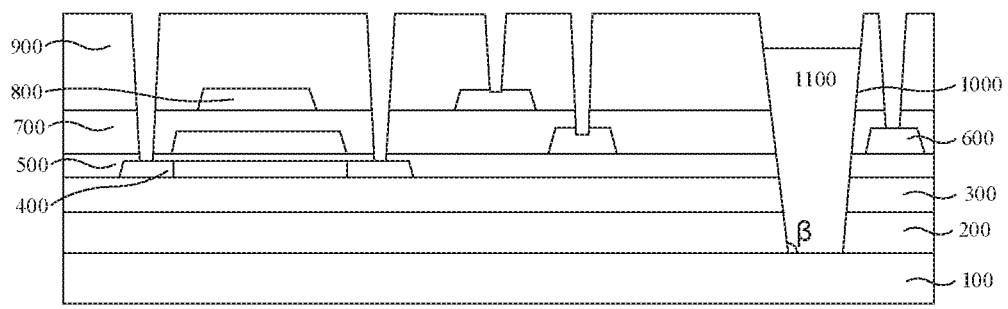
FIG. 10 is a schematic view of the fabrication of an embodiment of a contact hole of the metal wiring layer according to the present application.
Figure 11:
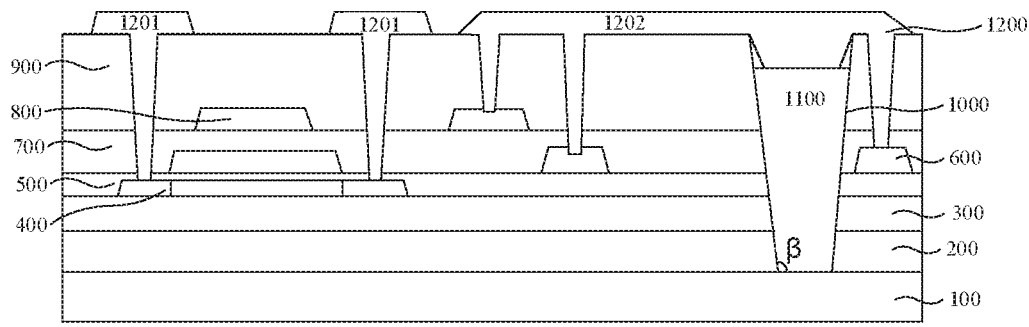
FIG. 11 is a schematic view of the fabrication of an embodiment of the metal wiring layer according to the present application.

Referring to FIGS. 10 and 11, FIG. 10 is a schematic view of the fabrication of an embodiment of a contact hole of the metal wiring layer according to the present application, and FIG. 11 is a schematic view of the fabrication of an embodiment of the metal wiring layer according to the present application. A metal wiring layer 1200 is formed on a flexible substrate filled with an organic film layer. The metal wiring layer 1200 further includes a source/drain layer. The metal wiring layer 1200 is configured to electrically connect the display portion A of the inorganic film layer to an external device through the bending area B. Therefore, it is necessary to form the metal wiring layer 1200 on the inorganic film layer of the display portion A and the organic film layer of the bending area B.

Specifically, the metal wiring layer 1200, i.e., the SD metal layer, is grown on the interlayer insulating layer ILD by magnetron sputtering, then exposing and etching to form a source/drain electrode (1201) and a metal signal wiring layer (1202), the SD metal wiring is connected with the metal wire on the side of the deep hole region through the contact hole to achieve the smoothing of the electrical signal; the SD metal wiring comes across the deep hole region, and the taper angle of the deep hole region ensures that the SD metal wiring at the step will not be disconnected, thereby improving the electrical performance.

In this embodiment, the metal wiring layer on the organic film layer includes a hollow metal wiring design. The hollow shapes include, but are not limited to, diamonds, circles, polygons, and the like, so as to improve the easy release of the stress of the metal wiring on the organic film layer, thereby improving the reliability of metal wiring.

Step S250: sequentially forming a planarization layer, an anode layer, and a pixel layer on the metal wiring layer to form a display panel.

Figure 12:
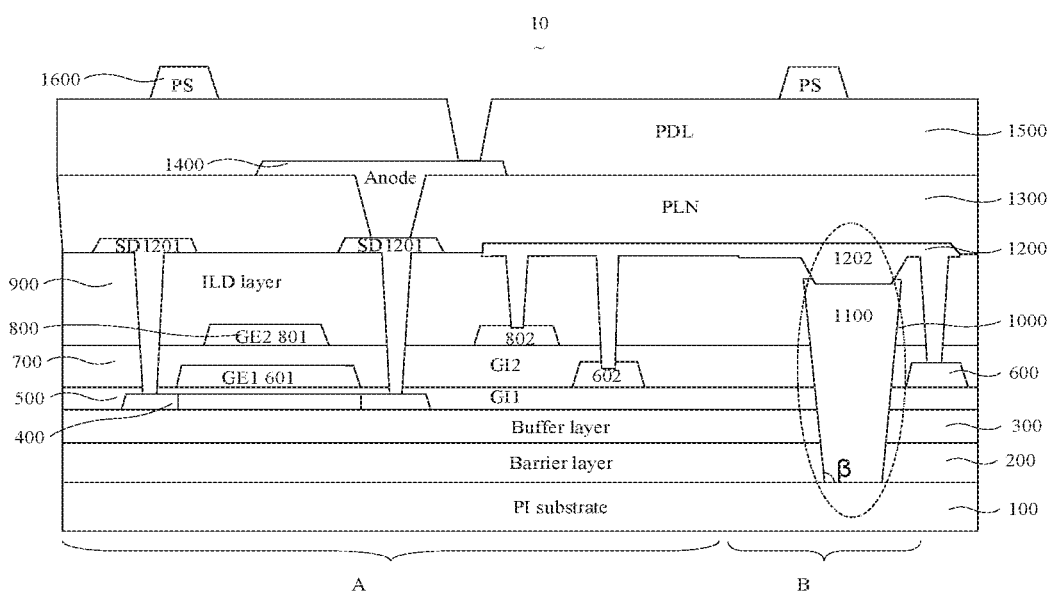
FIG. 12 is a schematic structural view of an embodiment of a display panel according to the present application.

Referring to FIG. 12, FIG. 12 is a schematic structural view of an embodiment of a display panel according to the present application. As shown in FIG. 12, an anode layer (1400) is formed by depositing and growing a planarized layer PLN (1300) on a metal wiring layer and forming a film by magnetron sputtering and then exposing and etching; then, the pixel layer (1500), the supporting layer PS (1600), and the organic light emitting layer (not shown) are formed by coating, exposure, and developing, and then are encapsulated to complete the fabricating process of the entire array substrate. For the fabricating method and process of the planarization layer 1300, the anode layer 1400, the pixel layer 1500, and other layers, reference may be made to the methods and processes for fabricating the display panel in the prior art, which are not limited herein.

The bendable display panel provided by the present application is manufactured by one-step etching or two-step etching to form a deep hole with a gentle slope, and the method of controlling the slope of the deep hole is controlled, thereby improving the metal wiring of the climbing ability to reduce or avoid the disconnection of the metal wiring led to the display panel signal loss phenomenon to enhance the quality of the display panel.

Referring to FIG. 12, in the present application, the display panel 10 includes a flexible substrate 100, an inorganic layer and an organic film layer 1100 sequentially disposed on the flexible substrate 100, and a metal wiring layer 1200 disposed on the inorganic film and the organic film layer 1100.

The inorganic film layer includes a barrier layer 200, a buffer layer 300, and a plurality of insulating layers sequentially stacked, and each of the insulating layers includes a metal signal layer; and a planarization layer 1300, an anode layer 1400, a pixel layer 1500, a support layer 1600, an organic light-emitting layer, and an encapsulation layer sequentially disposed on the insulating layer.

The plurality of insulating layers includes a first gate insulating layer 500, a second gate insulating layer 700, and an interlayer insulating layer 900. Each of the insulating layers includes a metal signal layer, that is, a first gate layer 600, a second gate layer 800, and the metal wiring layer 1200.

The planarization layer 1300, the anode layer 1400, the pixel layer 1500, the support layer 1600, the organic light-emitting layer, and the encapsulation layer are sequentially disposed on the metal wiring layer 1200.

The fabricating method of the organic film layer 1100 and the metal wiring layer 1200 is as described in the above method, and details are not described herein again.

Figure 13:
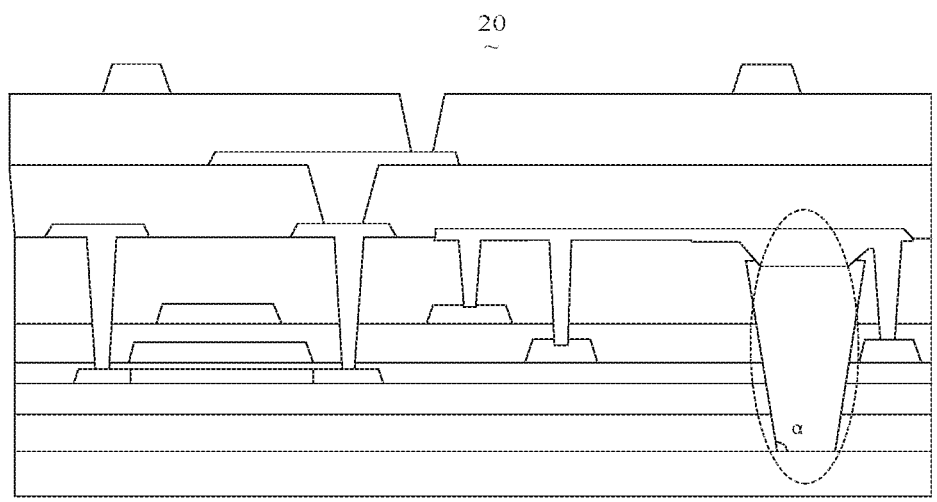
FIG. 13 is a schematic structural view of another embodiment of a bendable display panel according to the present application.

Referring to FIG. 13, FIG. 13 is a schematic structural diagram of another embodiment of a bendable display panel of the present application. As shown in FIG. 13, the structure of the present embodiment is basically the same as the structure of the first embodiment except that the structure of this embodiment adopts a one-step etching method so that the first slope of this embodiment is steeper than that of the first embodiment, and the angle of the first included angle α is also smaller than that of the second included angle β. See other structures above, which will not be described herein again.

Figure 14:
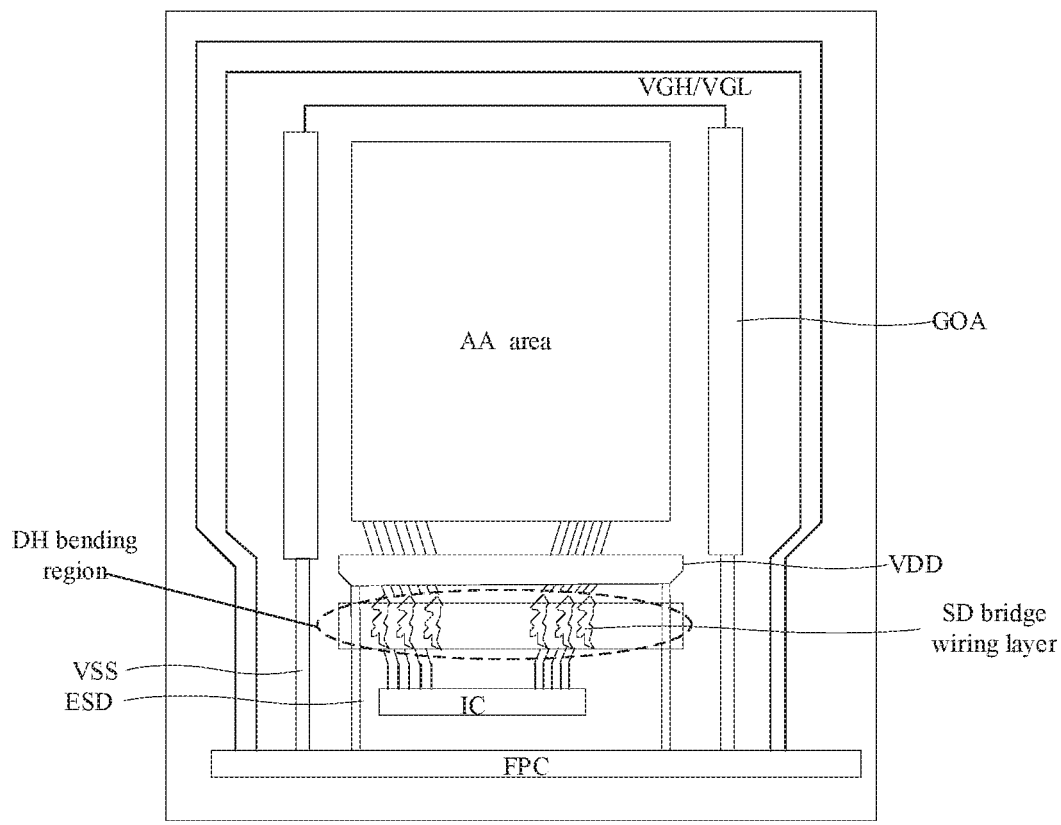
FIG. 14 a schematic structural view of an embodiment of the metal wire near the deep hole region according to the present application.

Referring to FIG. 14, FIG. 14 is a schematic structural diagram of an embodiment of a metal wiring near a deep hole in the present application. As shown in the figure, a bending area, called DH, is designed at the bottom border, the entire region of the bottom border can be folded to the back of the panel to perform IC bonding by the bending area. Since the Fanout region has the GE metal wiring closely spaced, is not easy to design a bend-resistant shape, so there is no GE metal wiring in the bending area. The dry etching was used to etch all the inorganic layers in the DH region and fill the organic materials with bending endurance. The GE metal wiring on both sides of the DH region were bridged with the SD metal wiring by drilling holes in the ILD layer. The SD metal wiring will connect the GE metal wiring of the Fanout region by going across the DH region. The SD metal wiring across the DH region can be designed to have a hollowed-out and porous shape that enhances the bending endurance. In the DH region, there is only an organic filling layer and a SD metal wiring layer that is more prone to release of bending stress. This results in a very good bending performance in the DH region. The entire lower border region of the panel can be bent backwards along the DH region. The FPC can be bonded to the back of the substrate, thereby resulting in a narrow frame of the entire panel.

Figure 15:
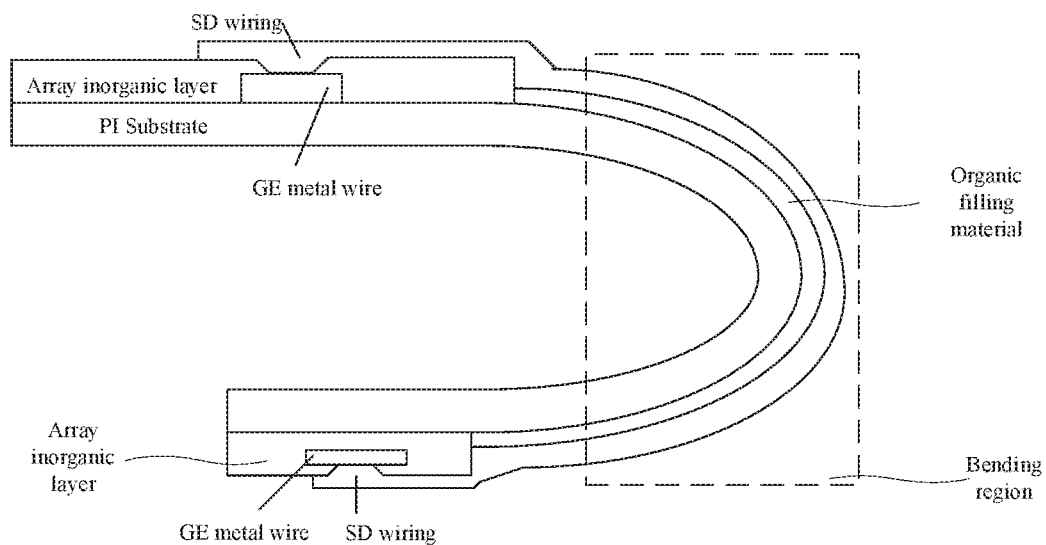
FIG. 15 is a Schematic diagram of the bending area of a first embodiment according to the present application.
Figure 16:
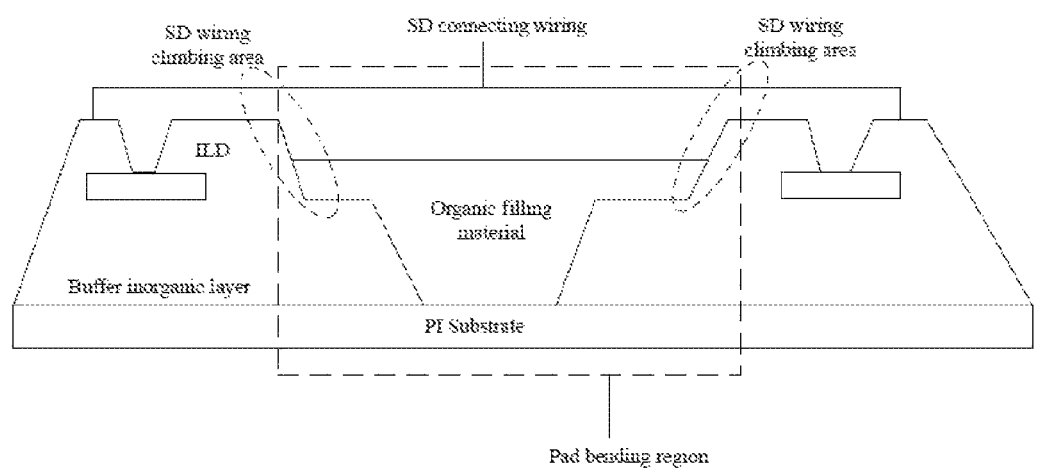
FIG. 16 is a schematic diagram of a second embodiment of the bending area according to the present application.

Referring to FIGS. 15 and 16. FIG. 15 is a schematic diagram of a first embodiment of a bending area of the present application, and FIG. 16 is a schematic diagram of a second embodiment of the bending area according to the present application. As shown in the figure, GE metal wiring layer of the Fanout region are spaced by Pad bending area, the GE metal wiring above and below the Fanout region of the Pa bending are connected to the SD metal wiring through the etched hole of the ILD, and the SD metal wiring connect the two parts of the GE metal wiring across the entire Pad bending area. After the ILD is deposited on the entire Array backplane, the inorganic film layer in the Pad bending area is completely etched away by dry etching, and then the organic material is filled, and the taper angle of the etching area can be changed by adjusting the dry etching process; after the taper angle of the etching area are optimized, the climbing ability of the SD metal wiring at the Pad bending area is greatly enhanced, avoiding the disconnection problem caused by the poor step coverage of the SD metal wiring caused by the too steep taper angle.

In addition, the SD metal wiring on the Pad bending area can be designed into a hollow shape to release the stress when the bending occurs. There is no inorganic layer that is not easy to release stress in the Pad bending area, and only the organic filling layer with better bending property and the metal wiring layer prone to release the stress are left, so that the array substrate can be folded back along the bending area without cracks or holes. After the OLED luminescent material and the encapsulation layer are evaporated, the bottom border region of the entire panel can be folded back to directly perform bonding to the FPC on the driver IC, thus minimizing the size of the bottom border of the screen to achieve narrow border of the screen.

In the above embodiments, the taper angle in the Pad bending area, i.e., the taper angle in the Deep Hole (DH) region, is controlled by using an optimized dry etching process. The taper angle control in the DH region can be controlled to be gentle by changing the etching gas proportion and the combination thereof, so that the SD metal wiring can climb the slope easier, not easy to produce a broken wire at the step, affecting the entire panel signal input.

In view of the above, those skilled in the art can easily understand that the present application provides a bendable display panel and a fabricating method thereof. By dry etching a gas to form a deep hole having a slope, thereby improving the metal wiring of the climbing ability to reduce or avoid the disconnection of the metal wiring led to the display panel signal loss phenomenon to enhance the quality of the display panel.

Above are only embodiments of the disclosure is not patented and therefore limit the scope of the disclosure, the use of any content of the present specification and drawings made equivalent or equivalent structural transformation process, either directly or indirectly related to the use of other technologies areas are included in the same way the scope of the patent protection of the disclosure.

What is claimed is:

1. A fabricating method of a bendable display panel, comprising:
   providing a flexible substrate and an inorganic film layer formed on the flexible substrate, wherein the inorganic film layer comprises a deep hole region disposed in a bending area;
   dry etching the deep hole region to form a deep hole having a slope, and a bottom of the deep hole is located on the flexible substrate;
   filling the deep hole with an organic material to form an organic film layer, wherein a thickness of the organic film layer ranges from 1.4 to 1.6 μm; and
   forming a metal wiring layer on the inorganic film layer and the organic film layer, further comprising:
   a planarization layer, an anode layer, and a pixel layer sequentially formed on the metal wiring layer to form a display panel;

wherein the step of dry etching the deep hole region to form the deep hole having a slope specifically comprises:
  dry etching the deep hole region by $SF_6$ gas to form the deep hole having a first slope; and
  dry etching the deep hole having the first slope by $C_2HF_5$ gas to form the deep hole having a second slope.

2. The fabricating method according to claim 1, wherein an included angle between the first slope and the flexible substrate and an included angle between the second slope and the flexible substrate range from 95° to 135°.

3. The fabricating method according to claim 1, wherein a slope length of the first slope is smaller than a slope length of the second slope.

4. The fabricating method according to claim 1, wherein the metal wiring layer on the organic film layer comprises a hollow metal wiring design.

5. The fabricating method according to claim 1, wherein the metal wiring layer on the organic film layer comprises a hollow metal wiring design.

6. A fabricating method of a bendable display panel, comprising:
  providing a flexible substrate and an inorganic film layer formed on the flexible substrate, wherein the inorganic film layer comprises a deep hole region disposed in a bending area;
  dry etching the deep hole region to form a deep hole having a slope, and a bottom of the deep hole is located on the flexible substrate;
  filling the deep hole with an organic material to form an organic film layer; and
  forming a metal wiring layer on the inorganic film layer and the organic film layer;
  wherein the step of dry etching the deep hole region to form the deep hole having a slope specifically comprises:
    dry etching the deep hole region by $SF_6$ gas to form the deep hole having a first slope; and
    dry etching the deep hole having the first slope by $C_2HF_5$ gas to form a deep hole having a second slope.

7. The fabricating method according to claim 6, wherein an included angle between the first slope and the flexible substrate and an included angle between the second slope and the flexible substrate range from 95° to 135°.

8. The fabricating method according to claim 6, wherein a slope length of the first slope is smaller than a slope length of the second slope.

9. The fabricating method according to claim 6, wherein a thickness of the organic film ranges from 1.4 to 1.6 μm.

10. The fabricating method according to claim 6, wherein the metal wiring layer on the organic film layer comprises a hollow metal wiring design.

11. The manufacturing method according to claim 6, wherein the method further comprises:
  a planarization layer, an anode layer, and a pixel layer sequentially formed on the metal wiring layer to form a display panel.

* * * * *